(12) United States Patent
Tian et al.

(10) Patent No.: US 7,368,179 B2
(45) Date of Patent: *May 6, 2008

(54) METHODS AND DEVICES USING HIGH EFFICIENCY ALKALINE EARTH METAL THIOGALLATE-BASED PHOSPHORS

(75) Inventors: Yongchi Tian, Princeton, NJ (US); Diane Zaremba, Fairless Hills, PA (US); Perry Niel Yocom, Washington Crossing, PA (US)

(73) Assignee: Sarnoff Corporation, Princeton, NJ (US)

( * ) Notice: Subject to any disclaimer, the term of this patent is extended or adjusted under 35 U.S.C. 154(b) by 387 days.

This patent is subject to a terminal disclaimer.

(21) Appl. No.: 10/823,288

(22) Filed: Apr. 13, 2004

(65) Prior Publication Data
US 2004/0206973 A1 Oct. 21, 2004

Related U.S. Application Data

(60) Provisional application No. 60/463,883, filed on Apr. 21, 2003.

(51) Int. Cl.
*H01L 27/15* (2006.01)
*H01L 29/22* (2006.01)
*B05D 5/12* (2006.01)
*H01J 5/16* (2006.01)
*C09K 11/08* (2006.01)

(52) U.S. Cl. .................. 428/690; 428/917; 427/66; 427/67; 252/301.4 S; 313/112; 257/80; 257/98

(58) Field of Classification Search .................. 257/40, 257/98; 428/690, 917; 252/301.4 S; 427/66, 427/67; 313/503, 506, 112
See application file for complete search history.

(56) References Cited

U.S. PATENT DOCUMENTS

| | | | |
|---|---|---|---|
| 4,710,033 A | 12/1987 | Hirano et al. | |
| 5,959,316 A | 9/1999 | Lowery | |
| 5,998,925 A | 12/1999 | Shimizu et al. | |
| 6,066,861 A | 5/2000 | Hohn et al. | |

(Continued)

FOREIGN PATENT DOCUMENTS

EP 1 150 361 A1 10/2001

(Continued)

OTHER PUBLICATIONS

Akella, A. and D. A. Keszler, "Sr2LiSiO4F: Synthesis, Structure, and Eu2+ Luminescence," Chem. Mater. 7(7):1299-302 (1995).

(Continued)

*Primary Examiner*—Milton I. Cano
*Assistant Examiner*—Camie S. Thompson
(74) *Attorney, Agent, or Firm*—Lowenstein Sandler PC

(57) ABSTRACT

The present invention provides a light emitting device comprising: a light output; a light source that produces light having a wavelengths of 530 nm or less; and a wavelength transformer located between the light source and the light output, where the wavelength transformer comprises $Sr_{1-x}Ca_xGa_2S_4$: $yEu^{2+} \cdot zGa_2S_3$, where x is 0.0001 to 1, y is a value defining sufficient $Eu^{2+}$ to provide luminescent emission, and z is 0.0001 to 0.2 based on the mole amount of $Sr_xCa_{1-x}Ga_2S_4$, and where the wavelength transformer effectively increases the light at the light output, the light having a wavelength between 535 nm and 560 nm.

21 Claims, 3 Drawing Sheets

U.S. PATENT DOCUMENTS

| | | | |
|---|---|---|---|
| 6,155,699 | A | 12/2000 | Miller et al. |
| 6,212,213 | B1 | 4/2001 | Weber et al. |
| 6,234,648 | B1 | 5/2001 | Borner et al. |
| 6,245,259 | B1 | 6/2001 | Hohn et al. |
| 6,252,254 | B1 | 6/2001 | Soules et al. |
| 6,255,670 | B1 | 7/2001 | Srivastava et al. |
| 6,273,589 | B1 | 8/2001 | Weber et al. |
| 6,277,301 | B1 | 8/2001 | Hohn et al. |
| 6,278,135 | B1 | 8/2001 | Srivastava et al. |
| 6,294,800 | B1 | 9/2001 | Duggal et al. |
| 6,303,403 | B1 | 10/2001 | Sato et al. |
| 6,351,069 | B1 | 2/2002 | Lowery et al. |
| 6,366,018 | B1 | 4/2002 | Garbuzov et al. |
| 6,373,188 | B1 | 4/2002 | Johnson et al. |
| 6,417,019 | B1 | 7/2002 | Mueller et al. |
| 6,501,100 | B1 | 12/2002 | Srivastava et al. |
| 6,501,102 | B2 | 12/2002 | Mueller-Mach et al. |
| 6,544,438 | B2 | 4/2003 | Yocom et al. |
| 6,586,882 | B1 | 7/2003 | Harbers |
| 6,695,982 | B2 * | 2/2004 | Ellens et al. .......... 252/301.4 S |
| 6,773,629 | B2 * | 8/2004 | Le Mercier et al. .. 252/301.4 S |
| 7,018,565 | B2 * | 3/2006 | Tian et al. ............ 252/301.4 S |
| 2001/0038426 | A1 | 11/2001 | Bechtel et al. |
| 2002/0030444 | A1 | 3/2002 | Muller-Mach et al. |
| 2003/0222268 | A1 * | 12/2003 | Yocom et al. ................ 257/98 |
| 2003/0227007 | A1 | 12/2003 | Ezuhara et al. |
| 2003/0228412 | A1 | 12/2003 | Chen |
| 2004/0116033 | A1 | 6/2004 | Ouderkirk et al. |
| 2004/0135504 | A1 | 7/2004 | Tamaki et al. |
| 2004/0145288 | A1 | 7/2004 | Ouderkirk et al. |
| 2004/0145289 | A1 | 7/2004 | Ouderkirk et al. |
| 2004/0145312 | A1 | 7/2004 | Ouderkirk et al. |
| 2004/0145895 | A1 | 7/2004 | Ouderkirk et al. |
| 2004/0145913 | A1 | 7/2004 | Ouderkirk et al. |
| 2004/0150991 | A1 | 8/2004 | Ouderkirk et al. |
| 2004/0159900 | A1 | 8/2004 | Ouderkirk et al. |
| 2005/0205845 | A1 | 9/2005 | Delsing et al. |
| 2005/0211992 | A1 | 9/2005 | Nomura et al. |
| 2005/0218780 | A1 | 10/2005 | Chen |
| 2005/0218781 | A1 | 10/2005 | Chen |
| 2005/0224828 | A1 | 10/2005 | Oon et al. |
| 2005/0230689 | A1 | 10/2005 | Setlur et al. |
| 2005/0239227 | A1 | 10/2005 | Aanegola et al. |
| 2006/0012287 | A1 * | 1/2006 | Tian et al. ................... 313/501 |
| 2006/0022582 | A1 | 2/2006 | Radkov |
| 2006/0027781 | A1 | 2/2006 | Dong et al. |
| 2006/0027785 | A1 | 2/2006 | Wang et al. |
| 2006/0027786 | A1 | 2/2006 | Dong et al. |
| 2006/0028122 | A1 | 2/2006 | Wang et al. |
| 2006/0033081 | A1 | 2/2006 | Hintzen et al. |
| 2006/0038477 | A1 | 2/2006 | Tamaki et al. |
| 2006/0049414 | A1 | 3/2006 | Chandran et al. |
| 2006/0061252 | A1 | 3/2006 | Sohn et al. |
| 2006/0071589 | A1 | 4/2006 | Radkov |
| 2006/0097245 | A1 | 5/2006 | Aanegola et al. |
| 2006/0145123 | A1 | 7/2006 | Li et al. |
| 2006/0181192 | A1 | 8/2006 | Radkov et al. |

FOREIGN PATENT DOCUMENTS

| | | |
|---|---|---|
| EP | 1 155 455 A1 | 11/2001 |
| EP | 1 160 883 A2 | 12/2001 |
| GB | 864343 | 4/1961 |
| GB | 1087655 | 4/1965 |
| GB | 1414381 | 11/1975 |
| WO | WO 97/48138 | 12/1997 |
| WO | WO 00/33389 | 6/2000 |
| WO | WO 01/24229 A2 | 4/2001 |
| WO | WO 01/24284 A1 | 4/2001 |
| WO | WO 01/50500 A2 | 7/2001 |
| WO | WO 01/69692 A1 | 9/2001 |
| WO | WO 01/89000 A1 | 11/2001 |
| WO | WO 01/89001 A2 | 11/2001 |
| WO | WO2006/001297 | 1/2006 |
| WO | WO2006/028104 | 3/2006 |

OTHER PUBLICATIONS

Bando, K., et al., "Development and Application of High-Brightness White LEDs," Tech Digest, Phosphor Res. Soc., 264th Meeting, 5-14 (Nov. 29, 1996). [In Japanese with English Summary].

Burrus, H. L. et al., "Fluorescence of Eu2+-Activated Alkaline Earth Halosilicates," J. Luminescence 3: 467-76 (1971).

Czaya, V. R. and G. Bissert, "Die Kristallstruktur von Tricalcium-monosilikatdichlorid (Ca2SiO4·CaCl2)," Acta Cryst. B27:747-53 (1971). [In German with English Abstract].

Garcia, A. et al., "Ba5SiO4Cl6:Eu, A New Blue-Emitting Photoluminescent Material with High Quenching Temperature," J. Electrochem. Soc.: Solid-State Science and Technology 126(10):1734-36 (Oct. 1979).

Golovastikov, N. I. And V. F. Kazak, "The Crystal Structure of Calcium Chlorosilicate Ca2SiO3Cl2," Sov. Phys. Crystallogr. 22(5):549-51 (Sep.-Oct. 1977).

Hermoneit, B. et al., "Single Crystal Growth and Some Properties of the New Compound Ca3Si2O7·1/3CaCl2," J. Cryst. Growth 52:660-62 (1981).

Liu, J. et al., "Eu2+-Doped High-Temperature Phase Ca3SiO4Cl2: A Yellowish Orange Phosphor for White- Emitting Diodes," J. Electrochem. Soc., 152(11): G880-84 (2005).

Nakamura S., et al., "Superbright Green InGaN Single-Quantum-Well-Structure Light-Emitting Diodes," Jpn. J. Appl. Phys. (Letters) 34 (Pt. 2, No. 10B):L1332-35 (Oct. 15, 1995).

Peters, T. E. and J. A. Baglio. "Luminescence and structural properties of thiogallate phosphors Ce3+ and Eu2 +-activated phosphors. Part I." J. Electrochem. Soc. 19(2):230-36 (1972).

Peters, T. E. "Luminescent properties of thiogallate phosphors: II. Ce3 +-activated phosphors for flying spot applications," J. Electrochem. Soc. 119(12):1720-23 (1972).

Sun, J. et al., "Study on Luminescence Properties of Eu2+ in (Sr, Ca)4Si3O8Cl4 Host Lattice," Guang Pu Xue Yu Guang Pu Fen Xi, 25(11):1760-63 (Nov. 2005). [In Chinese with English Abstract].

Wanmaker, W. L. and J. G. Verriet, "Luminescence of Phosphors with Ca3SiO4Cl2 as the Host Lattice," Philips Res. Repts. 28:80-83 (1973).

Winkler, A. et al., "On Chloride Silicates of Calcium, Strontium, and Barium," Z. Anorg. Allg. Chem. 504:89-94 (1983). [In German; German & English Abstracts Only].

Winkler, A. et al., "Two New Barium Bromide Silicates and the Molecular Constitution of their Silicate Anions," Z. Anorg. Allg. Chem. 542:131-36 (1986). [In German; German & English Abstracts Only].

Yen, W. M. and M. J. Weber, Inorganic Phosphors-Composition, Preparation and Optical Properties, CRC Press: Boca Raton, 2004, pp. 81-85.

Zhang, X. and X. Liu, "Luminescence Properties and Energy Transfer of Eu2+ Doped Ca8Mg(SiO4)4Cl2 Phosphors," J. Electrochem. Soc. 139(2):622-25 (Feb. 1992).

Derwent abstract of WO 200211214, Feb. 7, 2002.
Derwent abstract of WO 200193342, Dec. 6, 2001.
Derwent abstract of WO 200141215, Jun. 7, 2001.
Derwent abstract of WO 200002261, Jan. 13, 2000.
Derwent abstract of WO 200133640, May 10, 2001.
Derwent abstract of JP 2001107036, Apr. 17, 2001.
Derwent abstract of KR 2000007067, Feb. 7, 2000.

* cited by examiner

METHODS AND DEVICES USING HIGH EFFICIENCY ALKALINE EARTH METAL THIOGALLATE-BASED PHOSPHORS

This application claims the priority of U.S. Provisional Application No. 60/463,883, filed Apr. 21, 2003

The present invention relates to green emitting phosphors for light emitting diode lighting applications.

Phosphors, including alkaline earth metal thiogallate-based phosphors ($MGaS_4$) activated with divalent europium, divalent praseodymium, trivalent cerium, and the like are known. For example, Peters et al., J. Electrochem Soc. 119: 230 et seq., 1972 describes phosphors made by solid state reaction from alkaline earth sulfides, gallium sulfide and rare earth sulfides that emit in the green to yellow region of the spectrum. These phosphors have low emission efficiency. For use in color shifting for LED devices and the like, higher photoluminescence efficiency phosphors are desirable.

U.S. Pat. No. 6,544,438 discloses alkaline earth metal thiogallate phosphors having a small excess of gallium sulfide. These phosphors are made by mixing soluble alkaline earth salts with a gallium nitrate solution to produce an excess of gallium, precipitating the resulting sulfate salts, and firing these salts in hydrogen sulfide to form the thiogallate sulfide phosphors. The resulting green phosphors have improved efficiency, but emit at about 530 nm. However, for certain applications such as liquid crystal displays (LCDs) illuminated by backlighting, the green component should have a higher emission peak such as 535 nm to 560 nm.

Exemplary Embodiments

The phosphors of the invention are strontium calcium thiogallate doped with divalent europium, and having the following formula I:

$$Sr_{1-x}Ca_xGa_2S_4:yEu^{2+}\cdot zGa_2S_3, \quad (I)$$

Where x is 0.0001 to 1, y is a value defining sufficient $Eu^{2+}$ to provide luminescent emission (or, for example, 0.001 to 0.1 based on the mole amount of $Sr_{1-x}Ca_xGa_2S_4:yEu^{2+}$), and z is 0.0001 to 0.2 based on the mole amount of $Sr_{1-x}Ca_xGa_2S_4$.

Without being limited to theory, it is believed that the $zGa_2S_3$ component resides in a distinct phase, i.e., distinct crystalline domains in the phosphor body host.

Preferably, the phosphors of the present invention have an emission efficiency (i.e., quantum efficiency) of 50% or higher, or 65% or higher, or 75% or higher, or 85% or higher.

In certain embodiments, the range of x is from one of the following lower endpoints (inclusive) or from one of the following upper endpoints (inclusive). The lower endpoints are 0.0001, 0.001, 0.1, 0.2, 0.3, 0.4, 0.5, 0.6, 0.7, 0.8, and 0.9. The upper endpoints are 0.001, 0.1, 0.2, 0.3, 0.4, 0.5, 0.6, 0.7, 0.8, 0.9 and 1.0.

In certain embodiments, the range of y is from one of the following lower endpoints (inclusive) or from one of the following upper endpoints (inclusive). The lower endpoints are 0.001, 0.01, 0.02, 0.03, 0.04, 0.05, 0.06, 0.07, 0.08 and 0.09. The upper endpoints are 0.01, 0.02, 0.03, 0.04, 0.05, 0.06, 0.07, 0.08, 0.09 and 0.1. For example, the range can be 0.01 to 0.08 or 0.01 to 0.04.

In certain embodiments, the range of z is from one of the following lower endpoints (inclusive) or from one of the following upper endpoints (inclusive). The lower endpoints are 0.0001, 0.001, 0.01, 0.02, 0.03, 0.04, 0.05, 0.06, 0.07, 0.08, 0.09, 0.10, 0.11, 0.12, 0.13, 0.14, 0.15, 0.16, 0.17, 0.18 and 0.19. The upper endpoints are 0.001, 0.01, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19 and 0.2. In certain embodiments, z is 0.0001 to 0.1, or 0.001 to 0.2, or 0.001 to 0.1.

The emission peak is measured with the emission source being light at 440 nm±40 nm. In certain embodiments, the range is from one of the following lower endpoints (inclusive) or from one of the following upper endpoints (inclusive). The lower endpoints are 535, 536, 537, 538, 539, 540, 541, 542, 543, 544, 545, 546, 547, 548, 549, 550, 551, 552, 553, 554, 555, 556, 557, 558 or 559 nm. The upper endpoints are 560, 559, 558, 557, 556, 555, 554, 553, 552, 551, 550, 549, 548, 547, 546, 545, 544, 543, 542, 541, 540, 539, 538, 537 or 536 nm.

In one embodiment, the invention relates to light emitting device comprising: a light output; a light source producing light including wavelengths of 530 nm or less; and a wavelength transformer located between the light source and the light output, comprising $Sr_{1-x}Ca_xGa_2S_4:yEu^{2+}\cdot zGa_2S_3$, where x is 0.0001 to 1, y is a value defining sufficient $Eu^{2+}$ to provide luminescent emission, and z is 0.0001 to 0.2 based on the mole amount of $Sr_{1-x}Ca_xGa_2S_4$, the wavelength transformer effective to increase the light at the light output having wavelength between 535 nm and 560 nm. In certain embodiments, the device is used with one or more of the compositions described in this application.

In another embodiment, the invention relates to a method of making a strontium calcium thiogallate phosphor of formula $Sr_{1-x}Ca_xGa_2S_4:yEu^{2+}\cdot zGa_2S_3$, where x is 0.0001 to 1, y is a value defining sufficient $Eu^{2+}$ to provide luminescent emission, and z is 0.0001 to 0.2 based on the mole amount of Sr1 xCaxGa2S4, the method comprising: forming a composition of sulfate salts of gallium, divalent europium, calcium and, if x is not 1, strontium; and firing the composition under hydrogen sulfide. In certain embodiments, the method is used to create one or more of the compositions described in this application.

DETAILED DESCRIPTION OF THE INVENTION

Figure 1:
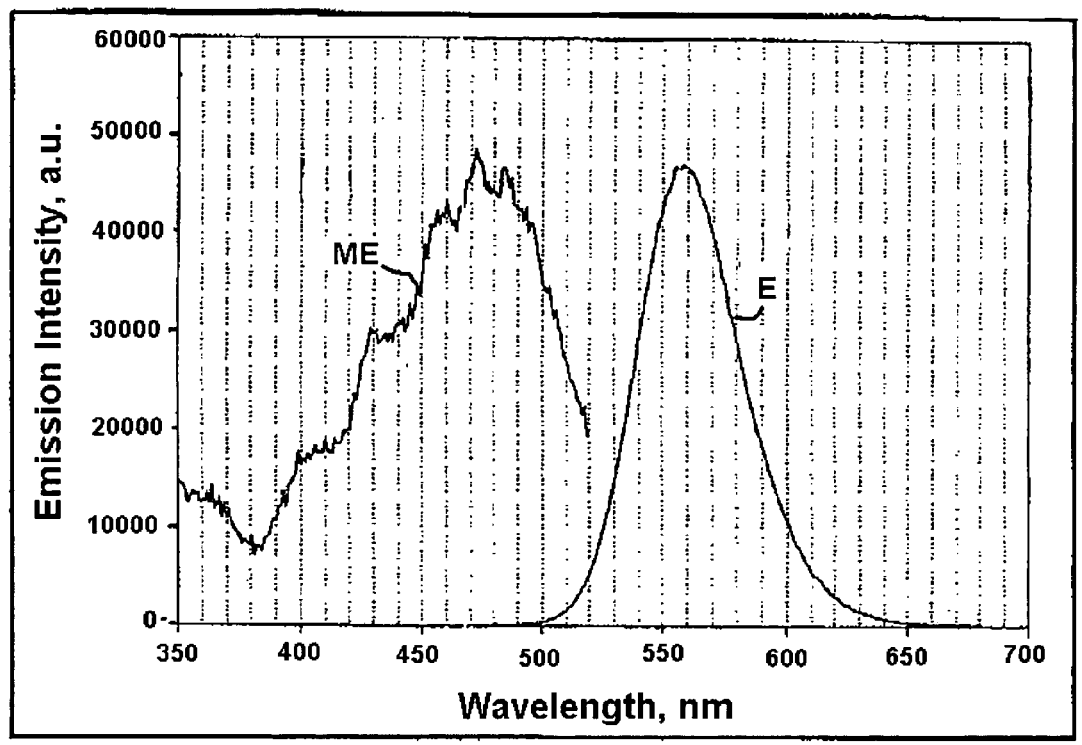
FIG. 1 displays a spectrum of a phosphor of the invention.

In formula I, the component $Sr_{1-x}Ca_xGa_2S_4:yEu^{2+}$, or "component Ia", forms a first crystalline component in the formulation, while the $zGa_2S_3$ is believed to form a second crystalline component, or "component Ib". The precise nature of the physical relationship between the two forms in the composition is not known, but the relative amounts of the two forms can be determined from the X-ray diffraction data. The variable "y" is determined by composition.

Where possible, z is determined by quantitative phase analysis of the X-ray diffraction using a Rietveld refinement procedure, which procedure is often called the whole pattern fitting procedure. Experience and a number of round robin comparisons published in the scientific literature have shown the method to be very accurate and is often quoted as the "gold standard" of quantitative analyses. The Rietveld method is based on a least-squares fit of a theoretical calculation of the whole diffraction pattern to an experimental pattern from the actual mixture of two or more phases

["Quantitative X-Ray Diffractometry" by Lev: S. Zevin and Giora Kimmel, Springer, New York/Berlin/Heidelberg, 1995, ISBN 0-387-94541-5; "Fundamentals of Powder Diffraction and Structural Characterization of Materials" by Vitalij K. Pecharsky and peter Y. Zavalij, Kluwer Academic Publishers, Boston/Dordrecht/London, 2003, ISBN 1-4020-7365-8.]. To perform such a refinement, information on the structure of each phase is used. For example, the chemistry, the unit cell parameters, the atomic positions within the crystal structure, the magnitude of the thermal vibrations about the equilibrium position, and the site occupancy are used. In addition to the structural parameters, information about the shape of the diffraction profiles is used. Based upon these data and known scattering physics of X-rays, a diffraction pattern is computed from first principles. Once this has been done, a residual can be computed as the difference between the pattern and experimental patterns. The Rietveld method then consists of minimizing the residual error by refining the structural model and the weight fraction of each phase until a stable minimum of the residual is obtained. A number of databases exist that contain the required information for the structural model. The two most widely used are the Inorganic Crystal Structure Database (ICSD) [Inorganic Crystal Structure Database, Fachinformationzentrum Energie Physik Mathematik, Karlsruhe, Germany, published annually] for inorganic materials and the Cambridge Structure Data base (CSD) [Cambridge Structure Data Base, Cambridge Crystallography Data Centre, Cambridge, England, published annually] for organic phases.

In particular, the method used to determine z was (where possible):
1) Phase identification was accomplished by comparing the experimental data to the powder Diffraction File [Powder Diffraction File, International Centre for Diffraction Data, Swarthmore, Pa., USA, published annually] to determine which phases were present;
2) Structural information was taken from the ICSD database once the phases were identified;
3) A Rietveld refinement was run using the Jade software v. 6.5 software package produced by Materials Data Inc. (Livermore, Calif., USA). The structural parameters that were refined were the weight fraction, lattice parameters, and line profile shape functions, instrumental systematic errors, and isotropic thermal parameters. The other structural parameters such as atomic positions and site occupancies were not refined, since experience has shown that these parameters should not be refined when the sample contains mixtures.

One way to estimate the quality of the Rietveld refinement is to look at the weighted profile residual $R_{wp}$. Good quality fits are found when $R_{wp} < 10\%$, which is often considered the threshold for publication quality results. For samples prepared using the invention, $R_{wp}$ values were in the range of 6%-9%, indicating that the proper structural model was used.

Generally, the emission peak inversely correlates with the value of parameter x. As x increases, the wavelength of the emission peak decreases.

Preferably, the emission peak has a bandwidth of 50 nm or less under excitation with an emission source at 440 nm±40 nm. The emission peak ranges for example from 535 nm to 560 nm.

One useful method of making the phosphors of the invention is as follows:

---

1. Dissolving gallium metal in an acid solution to form a first aqueous solution of trivalent gallium, such as gallium nitrate, where the amount of gallium is tuned, for example, to the range of 0.1 to 7% in excess of the stoichiometric amount of component Ia. Or, the amount can be tuned, for example to 1 to 7% in excess of the stoichiometric amount of component Ia.
2a. Dissolving a soluble salt of europium (such as europium nitrate) to form a second aqueous solution, and adding this second solution to the first solution to form a third aqueous solution. The amount of this dopant is tuned, for example, to the range of 1 to 4% of the stoichiometric amount of component Ia.
2b. Precipitating the metal salts with base (such as ammonium hydroxide) to create a gel-like solid. For example:
   $Ga(NO_3)_2 + Eu(NO_3)_2 \rightarrow Ga(OH)_3/Eu(OH)_3 \downarrow$
3a. In a separate reactor, dissolving a soluble calcium salt (such as calcium nitrate) and, if anticipated according to formula I, a soluble strontium salt (such as strontium nitrate) in dilute nitric acid.
3b. Precipitating the metal salts in crystalline form with sulfuric acid. For example:
   $Ca(NO_3)_2/Sr(NO_3)_2 + H_2SO_4 \rightarrow CaSO_4/SrSO_4 \downarrow$. Pre-made powders of $CaSO_4$ and $SrSO_4$ can be used instead.
4. Mixing the solids from steps 2b and 3b, drying the solids, and pulverizing the solids. The solids can be mixed in suspension.
5. Firing the mixed solids, for example at a temperature from 500 to 850 degrees C. under hydrogen sulfide, for example for five hours. Or, the temperature is 700 to 750 degrees C. or 650 to 750 degrees C., or 680 to 720 degrees C.
6. A heating step is applied, typically in a distinct heating step, to improve the crystallization of the product of step 5, for example at a temperature 750 to 950 degrees C. or 750 to 850 degrees C., or 780 to 820 degrees C. The time period is typically shorter than in the first firing, such as two hours. The product of step 5 can be re-ground prior to the second firing.

---

The fired product can be re-ground and sieved.

Other methods can be used. For example, a soluble strontium or calcium salt, such as the nitrates, can be dissolved in dilute nitric acid. The desired amount of europium salt (e.g., 1-6 mol percent) is added as a soluble aqueous solution. The europium salt can be, for example, the nitrate. The resulting solution can be precipitated by adding base such as ammonium carbonate. Thus, for example:

$$Sr(NO_3)_2 + Ca(NO_3)_2 + Eu(NO_3)_2 + (NH_4)_2CO_3 \rightarrow Sr_xCa_{1-x}CO_3\downarrow + Eu(OH)_3\downarrow + NH_4OH$$

The co-precipitated carbonates can be fired with an excess of ammonium sulfate (e.g., 25% molar excess) at, for example, about 200 degrees C., followed for example by firing at a higher temperature, such as about 1100 degrees C., to convert the carbonates to their sulfates. An acidic solution of a gallium salt, such as the nitrate salt, can be added to a solution of the sulfates. The pH can be brought to neutral or further to basic (for example using ammonium hydroxide), causing fine particles to precipitate. The resulting powder can be dried, ground, placed in a refractory boat (e.g., of alumina), and fired in hydrogen sulfide, e.g., for five hours in a tube furnace at about 800 degrees C. The resultant product has the formula:

$$Sr_{1-x}Ca_xGa_2S_4:yEu^{2+}\cdot zGa_2S_3, \quad (Ic)$$

where z is, for example, 0.0001 to 0.1 (or 0.01 to 10 mol percent). To increase uniformity, the product can be, for example, ground to a powder and re-fired in hydrogen sulfide at about 900 degrees C. for about two hours.

To avoid the difficulty of converting the gallium oxide to an oxide-free sulfide with hydrogen sulfide, the oxide is not recommended as a starting material.

The phosphors prepared as above are typically fine yellow powders. The fluorescence spectra of a phosphor of the invention, measured in both excitation (ME) and emission (E) mode, is shown in FIG. 1. The excitation spectrum was recorded by measuring emission intensity at 560 nm as a function of the excitation wavelength (350 nm to 520 nm). The main band in the excitation spectrum is centered at about 470 nm, and has a bandwidth (at half height) of about 75 nm. The emission spectrum was obtained by excitation at 460 nm. An emission maximum can be seen at 557±0.7 nm. The quantum efficiency was 55%.

Figure 2:
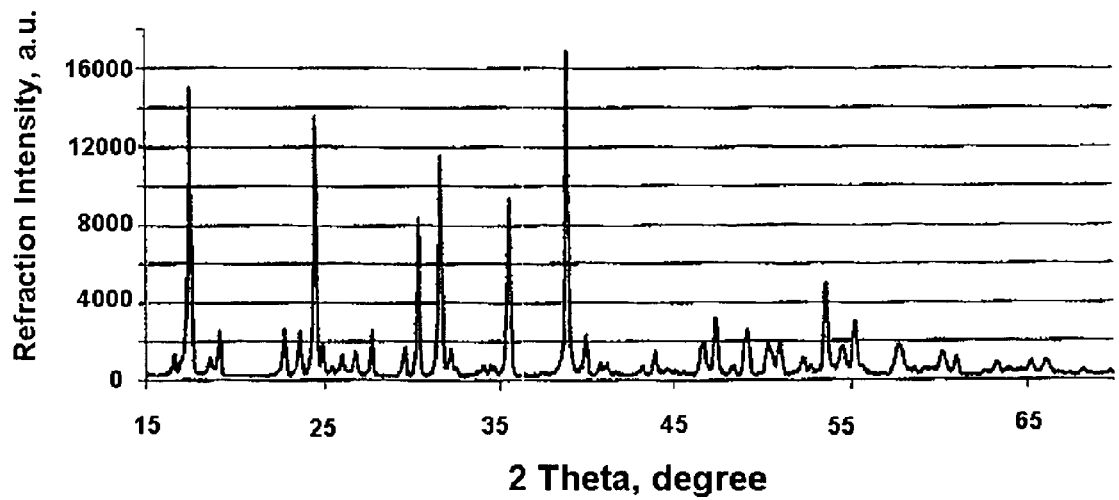
FIG. 2 shows a xrd spectrum of a phosphor of the invention.

A phosphor of the invention provided the X-ray powder diffraction spectrum shown in FIG. 2. The major diffractions were at 2 theta=16.6, 24.5, 30.3, 31.6, 35.5 and 38.9, indicating that the primary crystal was of the orthorhombic class. The diffraction symmetry and systematic absence are consistent with a space group $D_{2h}^{24}$. This crystal is isomorphous to strontium thiogallate.

Figure 3:
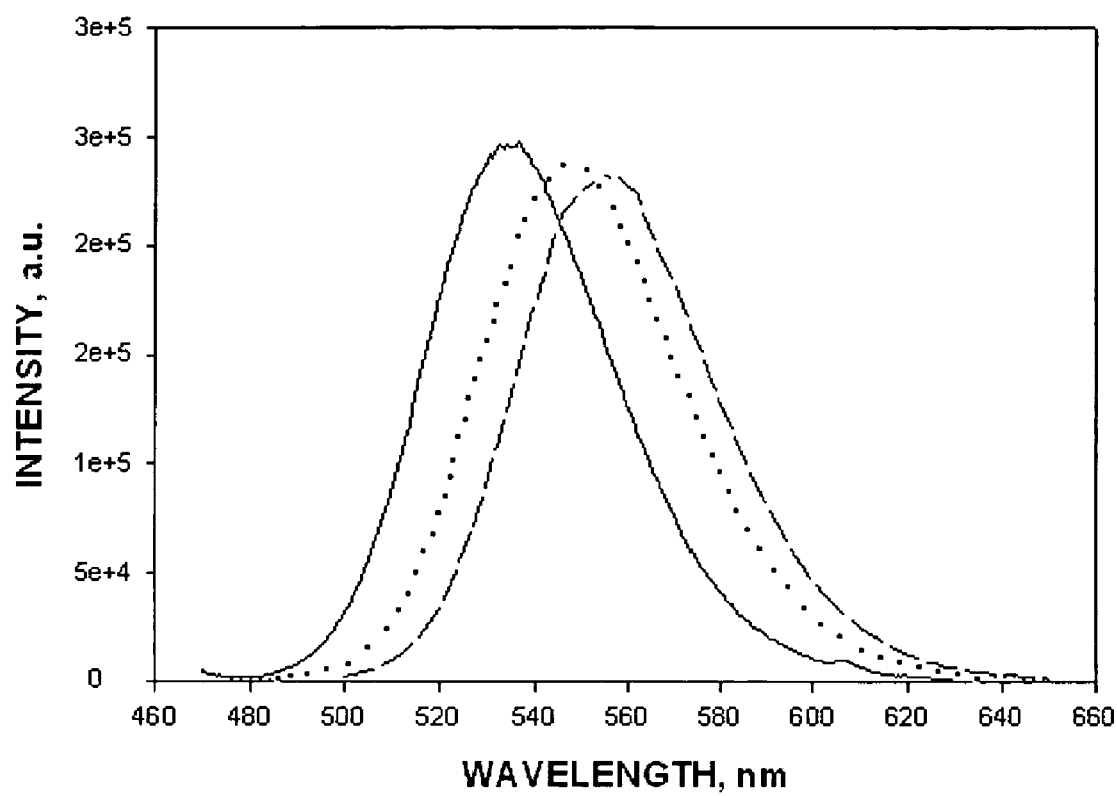
FIG. 3 shows spectra of two phosphors of the invention, and a strontium thiogallate phosphor.

FIG. 3 shows the emission spectrum of strontium thiogallate ($SrGa_2S_4:Eu^{2+}\cdot zGa_2S_3$, solid lines), strontium calcium thiogallate (SCTG, $Sr_{0.6}Ca_{0.4}Ga_2S_4:Eu^{2+}\cdot zGa_2S_3$, dotted line) and calcium thiogallate ($CaGa_2S_4:Eu^{2+}\cdot zGa_2S_3$, dashed line). The value for z was 0.07.

Figure 4A:
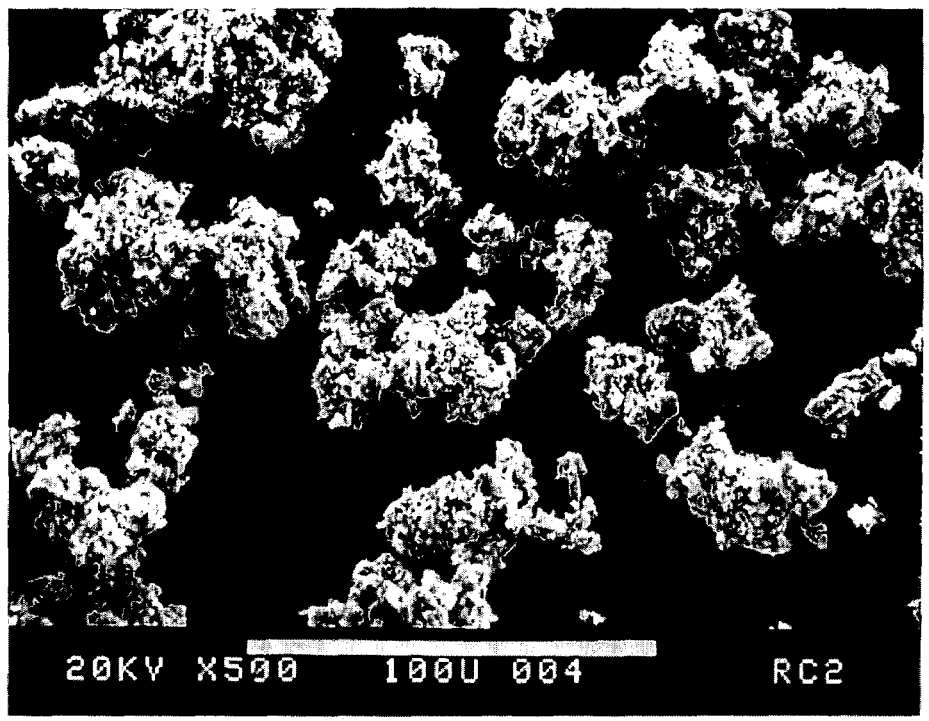
FIGS. 4A and 4B show micrographs of phosphors of the invention.
Figure 4B:
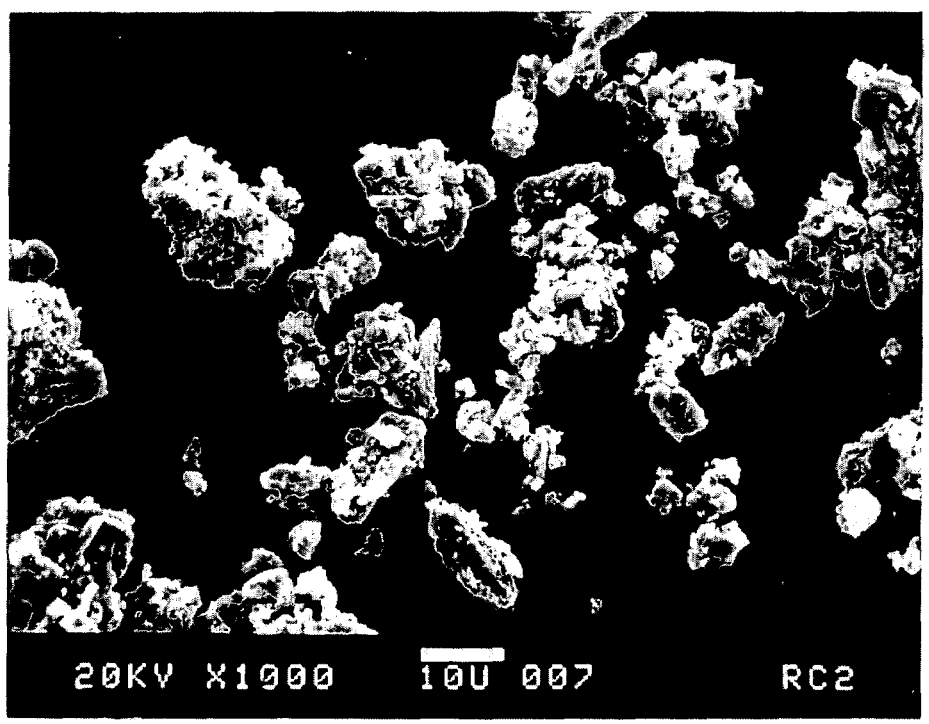

Scanning electron micrographs of a phosphor of the invention are shown in FIGS. 4A and 4B. The grains of the phosphor are largely agglomerates with a size of 3-40 microns. Irregularly shaped primary particles range in size from 2-4 microns, with interconnects between the primary particles. FIG. 3A is shown in relation to a 100 micron solid bar, while FIG. 3B is shown in relation to a 10 micron solid bar.

Phosphors of the type here described are typically used in light producing devices in thin films, the manufacturing of which is well known in the art. Phosphors located between a phosphor of the invention and a more primary light source can serve to modify the light reaching the phosphors of the invention. Hence, in relation to the phosphors of the invention, the light modified in this way is the relevant source light. Devices can include mirrors, such as dielectric mirrors, to direct light produced by the phosphors to the light output rather than the interior of the device (such as the primary light source). Construction of relevant devices is described in, for example, US Patent Publication 2002/0030444 and U.S. Pat. No. 6,069,440.

Temperatures described herein for processes involving a substantial gas phase are of the oven or other reaction vessel in question, not of the reactants per se.

The following examples further illustrate the present invention, but of course, should not be construed as in any way limiting its scope.

EXAMPLE

A process for making the phosphors of the invention (SCTG phosphors) is outlined as follows:

A solution of an acid-soluble gallium salt, such as the nitrate, is made. The amount of gallium used is of 3% in excess of the stoichiometric metal thiogallate formulation.

A solution of europium nitrate is added to the above made aqueous nitrate. The dopant level is 4%. After combining the Eu solution with the Ga solution, the pH of the aqueous system was brought to a neutral regime with ammonium hydroxide. Consequently, a gel-like solid precipitates out. An organic solvent then is added to the precipitate to disperse the gel.

$$Ga(NO_3)_3 + Eu(NO_3)_3 + NH_4OH \rightarrow Ga(OH)_3/Eu(OH)_3\downarrow \text{ (gel-like)} \quad (1)$$

A pre-made strontium sulfate powder is added to the $Ga(OH)_3/Eu(OH)_3$ suspension. The solid is then filtered out.

A pre-made calcium sulfate powder is added to the filtered solid followed by a mixing step.

The solid from the above two steps is oven dried and ground. It is then fired in hydrogen sulfide atmosphere for about five hours in a tube furnace. The temperature for the firings are ~700° C. for conversion and ~800° C. for crystallization, respectively. In the phosphor product, a minor crystalline phase of $Ga_2S_3$ exists in addition to the SCTG phase.

$$CaSO_4 + Ga(OH)_3/Eu(OH)_3 + H_2S \rightarrow CaGa_2S_4: Eu\cdot xGa_2S_3 \quad (3)$$

The phosphor powders are refined and sieved.

By selecting the strontium/calcium ratios, the following formulations are obtained:

| No. | Sr/Ca Ratio | Formula | Emission Peak Wavelength, nm |
|---|---|---|---|
| 1 | 6/4 | $Sr_{0.6}Ca_{0.4}Ga_2S_4:Eu^{2+}\cdot zGa_2S_3$ | 546 |
| 2 | 5/5 | $Sr_{0.5}Ca_{0.5}Ga_2S_4:Eu^{2+}\cdot zGa_2S_3$ | 547 |
| 3 | 4/6 | $Sr_{0.4}Ca_{0.6}Ga_2S_4:Eu^{2+}\cdot zGa_2S_3$ | 549 |
| 4 | 3/7 | $Sr_{0.3}Ca_{0.7}Ga_2S_4:Eu^{2+}\cdot zGa_2S_3$ | 550 |
| 5 | 2/8 | $Sr_{0.2}Ca_{0.8}Ga_2S_4:Eu^{2+}\cdot zGa_2S_3$ | 551 |

The value of z in the above formulations was 0.07.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

While this invention has been described with an emphasis upon preferred embodiments, it will be obvious to those of ordinary skill in the art that variations in the preferred devices and methods may be used and that it is intended that the invention may be practiced otherwise than as specifically described herein. Accordingly, this invention includes all modifications encompassed within the spirit and scope of the invention as defined by the claims that follow.

What is claimed:

1. A light emitting device comprising:
    a light output;
    a light source producing light including wavelengths of 530 nm or less; and
    a wavelength transformer located between the light source and the light output, comprising $Sr_{1-x}Ca_xGa_2S_4:yEu^{2+}\cdot zGa_2S_3$, wherein:
    x is 0.0001 to 1;
    y is a value defining sufficient $Eu^{2+}$ to provide luminescent emission;
    z is 0.0001 to 0.2 based on the mole amount of $Sr_xCa_{1-x}Ga_2S_4$; and
    the wavelength transformer effectively increases the light at the light output, the light having a wavelength between 535 nm and 560 nm.

2. The light emitting device of claim 1, wherein z is 0.001 to 0.2.

3. The light emitting device of claim 1, wherein z is 0.001 to 0.1.

4. The light emitting device of claim 1, wherein y is 0.001 to 0.1 based on the mole amount of $Sr_{1-x}Ca_xGa_2S_4$.

5. The light emitting device of claim 4, wherein y is 0.01 to 0.08.

6. The light emitting device of claim 4, wherein y is 0.01 to 0.04.

7. The light emitting device of claim 1, wherein the phosphor has an emission peak of 535 nm to 560 nm.

8. The light emitting device of claim 7, wherein the emission peak has a bandwidth of 50 nm or less under excitation with an emission source at 440 nm±40 nm.

9. A method of making a strontium calcium thiogallate phosphor of formula $Sr_{1-x}Ca_xGa_2S_4:yEu^{2+}\cdot zGa_2S_3$, wherein:
    x is 0.0001 to 1;
    y is a value defining sufficient $Eu^{2+}$ to provide luminescent emission; and
    z is 0.0001 to 0.2 based on the mole amount of $Sr_{1-x}Ca_xGa_2S_4$, the method comprising:
    forming a composition of sulfate salts of gallium, divalent europium, calcium and, if x is not 1, strontium; and
    firing the composition under hydrogen sulfide.

10. The method of claim 9, wherein z is 0.001 to 0.2.

11. The method of claim 9, wherein an amount of gallium is tuned to the range of 0.1 to 7% in excess of the stoichiometric amount of $Sr_xCa_{1-x}Ga_2S_4:yEu^{2+}$.

12. The method of claim 9, further comprising:
    a second firing of the composition following the fixing under hydrogen sulfide.

13. The method of claim 12, wherein the firing under hydrogen sulfide is conducted at 500 to 850 degrees C.

14. The method of claim 13, wherein the second firing is conducted at 750 to 950 degrees C.

15. The method of claim 13, wherein the product of the firing under hydrogen sulfide is ground prior to the second firing.

16. The method of claim 9, wherein z is 0.001 to 0.1.

17. The method of claim 9, wherein y is 0.001 to 0.1 based on the mole amount of $Sr_{1-x}Ca_xGa_2S_4$.

18. The method of claim 17, wherein y is 0.01 to 0.08.

19. The method of claim 18, wherein y is 0.01 to 0.04.

20. The method of claim 9, wherein the phosphor has an emission peak of 535 nm to 560 nm.

21. The method of claim 20, wherein the emission peak has a bandwidth of 50 nm or less under excitation with an emission source at 440 nm±40 nm.

* * * * *